(12) United States Patent
Cetin et al.

(10) Patent No.: US 7,683,730 B2
(45) Date of Patent: Mar. 23, 2010

(54) DIFFERENTIAL CRYSTAL OSCILLATOR CIRCUIT WITH PEAK REGULATION

(75) Inventors: Joseph Andrew Cetin, San Diego, CA (US); Jason Faris Muriby, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 75 days.

(21) Appl. No.: 11/230,587

(22) Filed: Sep. 20, 2005

(65) Prior Publication Data

US 2006/0071729 A1 Apr. 6, 2006

Related U.S. Application Data

(60) Provisional application No. 60/612,826, filed on Sep. 24, 2004.

(51) Int. Cl.
*H03L 1/00* (2006.01)
(52) U.S. Cl. .................. 331/186; 331/158; 331/183
(58) Field of Classification Search .......... 331/158, 331/160, 183, 186
See application file for complete search history.

(56) References Cited

U.S. PATENT DOCUMENTS

| | | | | |
|---|---|---|---|---|
| 4,358,742 A * | 11/1982 | Ferriss | .......... | 331/158 |
| 4,862,114 A * | 8/1989 | Kleinberg | .......... | 331/158 |
| 5,142,249 A | 8/1992 | Hirotomi | | |
| 5,202,687 A | 4/1993 | Distinti | | |
| 5,909,152 A * | 6/1999 | Li et al. | .......... | 331/116 FE |
| 6,025,757 A * | 2/2000 | Tsukagoshi et al. | .......... | 331/158 |
| 6,072,372 A | 6/2000 | Yokoyama | | |
| 6,091,307 A * | 7/2000 | Nelson | .......... | 331/109 |
| 6,144,327 A | 11/2000 | Distinti et al. | | |
| 6,157,265 A | 12/2000 | Hanjani | | |
| 6,563,391 B1 * | 5/2003 | Mar | .......... | 331/116 R |
| 6,798,301 B1 * | 9/2004 | Balan et al. | .......... | 331/74 |
| 6,956,443 B2 * | 10/2005 | Ruffieux | .......... | 331/158 |
| 7,042,298 B2 * | 5/2006 | Nakahi et al. | .......... | 331/158 |
| 7,061,338 B2 * | 6/2006 | Arigliano | .......... | 331/109 |
| 7,138,881 B2 * | 11/2006 | Lin | .......... | 331/158 |
| 2008/0048795 A1 * | 2/2008 | Hoshino et al. | .......... | 331/183 |

OTHER PUBLICATIONS

Microelectronic Circuits, 5th ed. Sedra, Smith 2004. pp. 239-241.*
International Search Report of the International Search Authority for International Application No. PCT/US05/33911 dated Apr. 5, 2007; 3 pages.
The Written Opinion of the International Search Authority for International Application No. PCT/US05/33911 dated Apr. 5, 2007; 5 pages.
USPTO Notice of Allowance for U.S. Appl. No. 09/842,966 dated Nov. 1, 2002; 4 pages.
USPTO Non-Final Rejection for U.S. Appl. No. 09/842,966 dated Jun. 6, 2002; 6 pages.

* cited by examiner

*Primary Examiner*—Robert Pascal
*Assistant Examiner*—James E Goodley

(57) ABSTRACT

A clock circuit has a crystal. A differential amplifier has a first input coupled to a first node of the crystal and a second input of the differential amplifier coupled to a bias signal and an output of the differential amplifier coupled to a second node of the crystal.

19 Claims, 3 Drawing Sheets

DIFFERENTIAL CRYSTAL OSCILLATOR CIRCUIT WITH PEAK REGULATION

RELATED APPLICATIONS

The present invention claims priority on provisional patent application, Ser. No. 60/612,826, filed on Sep. 24, 2004, entitled "Crystal Oscillator With Internal Current Control and Increase Noise Immunity".

FIELD OF THE INVENTION

The present invention relates generally to the field of electronic circuits and more particularly to a clock circuit and method.

BACKGROUND OF THE INVENTION

Crystal oscillator circuits are widely used in industry, and perform the function of producing a steady and stable, periodic time-varying waveform which is used as the timing signal for a given electronic circuit or a clock signal for a system timing.

A conventional crystal oscillator solution uses a fixed amount of current during startup and during normal operation. The amount of current necessary for startup is greater than that needed for normal operation; however, the conventional solution continues to use the greater amount of current. A crystal oscillator circuit requires a large amount of current to bring the crystal oscillator to a steady state operation where periodic waveforms with full swing are generated from a startup condition where the external and internal circuitry initial startup is from a non steady state operation. Once the steady state oscillation operation is reached, the crystal oscillator circuitry only needs to provides small amounts of current in order to compensate the losses due to the quartz crystal itself so to sustain the oscillation. The first purpose of crystal oscillator amplifier circuits is to bring about a steady and periodic oscillation from a startup condition where there exists no oscillation, and the second purpose is to sustain periodic oscillation once the steady oscillation is reached. The amount of current necessary to guarantee the first condition above is generally several multiples greater than the current necessary to guarantee the second condition. In general, conventional crystal oscillator topologies are designed to consume current to guarantee the first condition even after a steady state oscillation is reached. This creates unnecessarily large amounts of current consumption during steady state condition since this current consumption for startup is much larger than necessary for steady state operation.

It would be desirable to have a crystal oscillator circuit where the current consumption of the gain element is adjustable. In order to achieve a better overall current consumption, the crystal oscillator will be allowed to consume a large amount of current to get to steady state oscillation condition from startup. Once the steady state oscillation is achieved, the circuitry can be programmed to provide only the amount of current necessary to sustain the oscillation.

SUMMARY OF INVENTION

A clock circuit that overcomes these and other problems has a crystal. A differential amplifier has a first input coupled to a first node of the crystal and a second input of the differential amplifier coupled to a bias signal and an output of the differential amplifier coupled to a second node of the crystal. The differential amplifier may have a variable gain. The clock circuit may further include a peak detect circuit coupled to the output of the differential amplifier. An output of the peak detect circuit may be coupled to a gain control of the differential amplifier. The output of the peak detect circuit may be a binary signal. The variable gain may be a controllable current source. The clock circuit may further including a squaring circuit having a first input coupled to the output of the differential amplifier and a second input coupled to an input signal.

In one embodiment, a method of operating a clock circuit includes the steps of applying a first current level to a crystal clock during a start-up condition. A second current level is applied to the crystal clock during an operating condition. A first current level may be greater than a second current level. If an output of the clock circuit exceeds a predetermined level, the second current level is applied to the crystal clock. A gain of a differential amplifier of the crystal clock may be reduced to lower the current level. The step of reducing the gain of the differential amplifier may include the step of turning off a current source of the differential amplifier. The predetermined level may be set to given level. The output of the crystal clock may be digitized to determine its level.

In one embodiment, a clock circuit includes a crystal. A variable gain circuit may have an input coupled to a first node of the crystal and an output coupled to a second node of the crystal. A programmable control circuit may have a control signal coupled to a gain input of the variable gain circuit. The variable gain circuit may have a differential amplifier. The differential amplifier may have a variable current source. The programmable control circuit may include a peak detect circuit having an analog to digital converter. A decoder may be coupled to the analog to digital converter. A squaring circuit may have an input coupled to an output of the variable gain circuit.

DETAILED DESCRIPTION OF THE DRAWINGS

The clock circuit invention has two distinct operating regions. In the power-up or start-up stage during which the clock circuit draws a comparatively large amount of current. In the standard operating mode the clock circuit draws a small amount of current. This is accomplished using a variable gain amplifier and a peak amplitude detector and controller. By reducing the current draw, the clock requires less power. Power consumption in integrated circuits is becoming more and more important to the industry.

Figure 1:
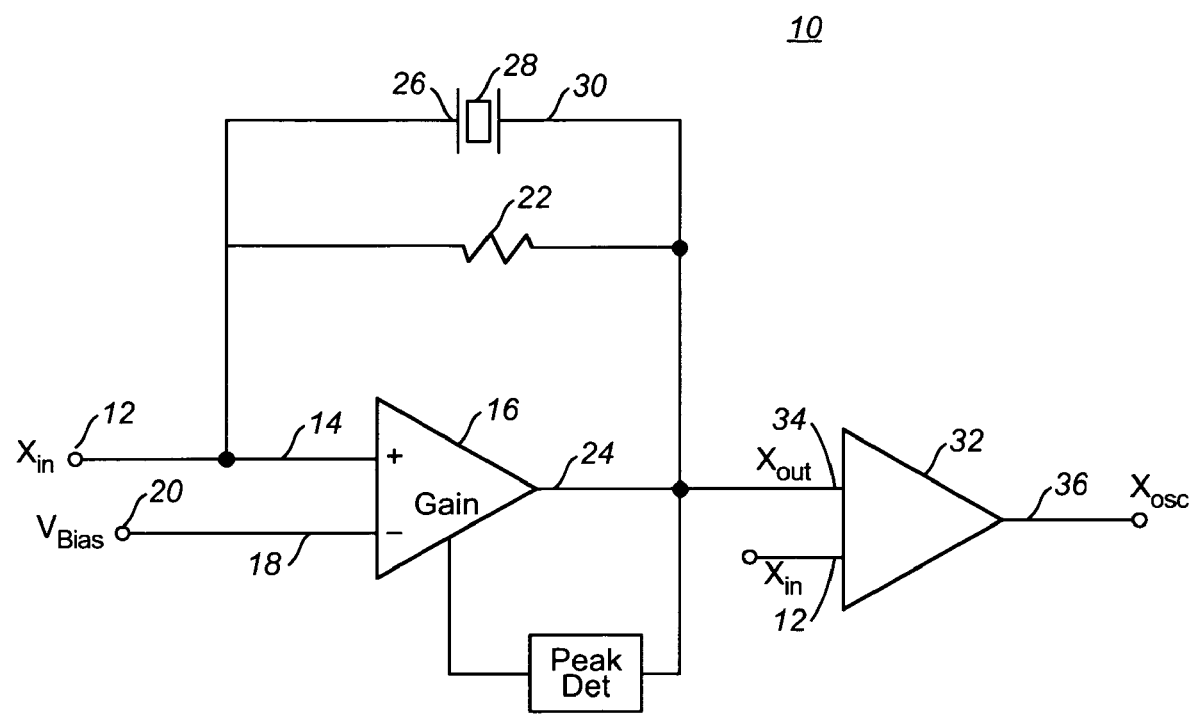
FIG. 1 is a block diagram of a clock circuit in accordance with one embodiment of the invention.

FIG. 1 is a block diagram of a clock circuit 10 in accordance with one embodiment of the invention. The clock circuit 10 has an input signal 12 coupled to a positive input 14 of a differential amplifier 16. The negative input 18 is coupled to a bias voltage signal (Vbias) 20. A feedback resistor 22 is coupled between the positive input 14 of the differential amplifier 16 and the output 24 of the differential amplifier 16. A first node 26 of a crystal 28 is coupled to the positive input 14 of the differential amplifier 16. A second node 30 of the crystal 26 is coupled to the output 24 of the differential amplifier 16. A first input 34 of a squaring circuit 32 is coupled to the output 24 of the differential amplifier 16. In one embodiment the squaring circuit 32 is a differential amplifier. A second input of the squaring circuit 32 is coupled to the input signal 12. The output (Xosc) 36 of the squaring circuit 32 is the clock signal. The output (Xout) 24 of the differential amplifier is coupled to a peak detect circuit 38.

Figure 2:
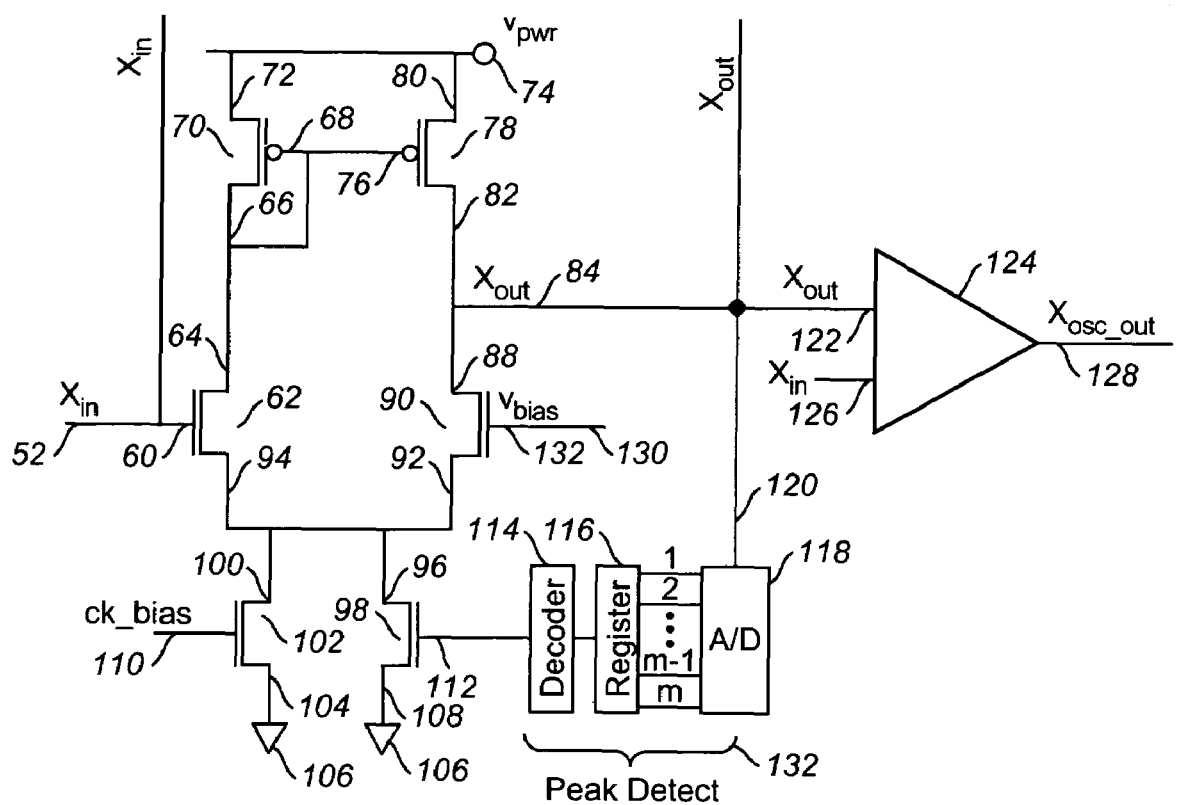
FIG. 2 is a circuit diagram of a clock circuit in accordance with one embodiment of the invention.

FIG. 2 is a circuit diagram of a clock circuit 50 in accordance with one embodiment of the invention. The clock circuit 50 had an input signal 52 coupled to a first node 54 of a crystal 56. The input signal 52 is coupled to a feedback resistor 58. The inputs signal 52 is also coupled to a gate 60 of an n-channel MOS (Metal Oxide) FET (Field Effect Transistor) transistor 62. The drain 64 of transistor 62 is coupled to a drain 66 and a gate 68 of a p-channel FET (Field Effect Transistor) transistor 70. The source 72 of the transistor 70 is coupled to power supply voltage (Vpwr) 74. The gate 68 of the transistor 70 is coupled to the gate 76 of p-channel FET (Field Effect Transistor) transistor 78. The source 80 of transistor 78 is coupled to the power supply voltage 74. The drain 82 of transistor 78 forms the output (Xout) 84 and is coupled to the feedback resistor 58 and the second node 86 of the crystal 56. The drain 82 of transistor 78 is coupled to the drain 88 of n-channel FET (Field Effect Transistor) transistor 90. The source 92 of the transistor 90 is coupled to the source 94 of transistor 62. The source 92 of the transistor 90 is coupled to the drain 96 of an n-channel FET (Field Effect Transistor) transistor 98 and to the drain 100 of an n-channel FET (Field Effect Transistor) transistor 102. The drain 104 of transistor 102 is coupled to ground 106. The drain 108 of transistor 98 is coupled to ground 106. The gate 110 of transistor 102 is coupled to current supply bias signal (CS_BIAS) 110. The drain 112 of transistor 98 is coupled to a decoder 114. The decoder 114 is coupled to a register 116. The register 116 is coupled to an analog to digital converter (A/D) 118. The input 120 of the A/D converter 118 is coupled to the output signal 84.

The output signal 84 is coupled to an input 122 of a squaring circuit 124. The second input 126 of the squaring circuit 124 is coupled to the input signal 52. The output (Xosc) 128 of the squaring circuit 124 is the clock signal.

The transistors 62, 70, 78, 90, 98, 102 form a variable gain differential amplifier having inputs (Xin) 52 and Vbias 130. Note that the Vbias 130 signal is coupled to the gate 132 of transistor 90. The transistors 98 & 102 are current sources for the differential amplifier. In one embodiment, there are additional current sources, which may be transistors in parallel with transistors 98 & 102.

The decoder 114, register 116 and A/D converter 118 form a peak detector 132. Note that the peak detector controls the current source 98 and in another embodiment may control multiple current sources. The peak detector 132 may not contain the register 114. In yet another embodiment, the peak detector 132 may be replaced with an analog comparator circuit that triggers a latch circuit. The advantage of the present peak detector is that it is programmable as to the threshold at which the current sources are turned off. The register 116 allows the peak detect circuit to control several current sources.

Figure 3:
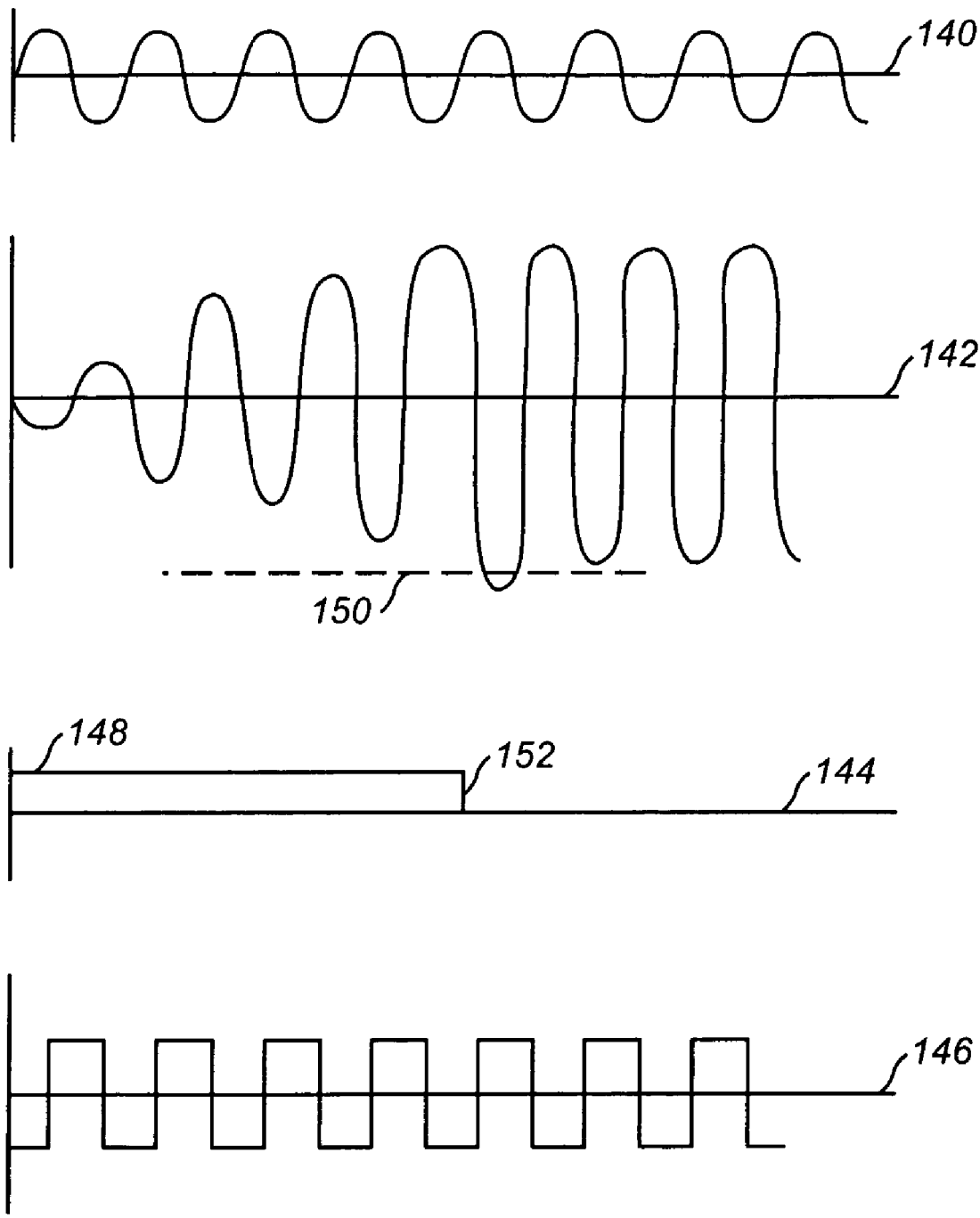
FIG. 3 is a signal diagram of clock circuit in accordance with one embodiment of the invention.

FIG. 3 is a signal diagram of clock circuit in accordance with one embodiment of the invention. The top trace 140 is the input signal (Xin) 52 showing amplitude versus time. The second trace 142 is the output signal (Xout) 84 showing amplitude versus time. The third trace 144 is the gain control signal 112 showing amplitude versus time. The fourth trace 146 is the clock signal 148 showing amplitude versus time. During the initial start-up period the gain control signal 144 is high 148 as a result the current source (transistor) 98 is on and drawing current. As a result, the differential amplifier is in a high gain mode. The output signal 142 initial has a low amplitude that builds over time. When the amplitude of the output signal 142 exceeds a threshold 150 this is detected by the peak detect signal and the gain signal is turned off or low 152. As a result, the transistor 98 no longer draws current and the amplitude of the output signal (Xout) 84 flattens out.

The squaring circuit 124 has its first input coupled to (Xout) 84, 142 and its inverse input 126 coupled to the input signal 52, 140. The output signal 84 is 180 degrees out of phase with the input signal 52 and as a result the clock output (Xosc) 128 is a square wave, signal 146. The squaring circuit 124 also serves to reject any common mode noise between the input 52 and the output 84.

A method of operating a clock circuit includes the steps of applying a first current level to a crystal clock during a start-up condition. A second current level is applied to the crystal clock during an operating condition. A first current level may be greater than a second current level. If an output of the clock circuit exceeds a predetermined level, the second current level is applied to the crystal clock. A gain of a differential amplifier of the crystal clock may be reduced to lower the current level. The step of reducing the gain of the differential amplifier may include the step of turning off a current source of the differential amplifier. The predetermined level may be set to given level. The output of the crystal clock may be digitized to determine its level.

Thus there has been described a clock circuit that uses less current and power in the operating mode than in the start up mode. In addition, the clock circuit rejects common mode noise between the input and output signals. The clock circuit also has a programmable threshold for switch between the operating mode and the start up mode.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A clock circuit comprising:
   a crystal clock enabled by a variable current source configured in multiple current levels
   a differential amplifier configured to generate a variable gain and having a first input terminal coupled to a first node of the crystal clock, a second input terminal coupled to a bias signal voltage and having no current path to an output terminal, and the output terminal coupled to a second node of the crystal clock; and
   a digitally programmable peak detect circuit coupled between the output terminal and a gain control terminal of the differential amplifier, wherein the digitally programmable peak detect circuit is configured to control, based on a programmable digital threshold value, the variable current source to provide:
   a first current level during a start-up mode; and
   a second current level during an operating mode, wherein the first level is greater then the second level.

2. The clock circuit of claim 1, wherein an output of the peak detect circuit is coupled to a gain control of the differential amplifier.

3. The clock circuit of claim 1, wherein the variable gain is controllable.

4. The clock circuit of claim 1, further including a squaring circuit having a first input coupled to an output of the differential amplifier and a second input coupled to an input signal.

5. A clock circuit comprising:

a crystal clock enabled by a variable current source operating in a plurality of current levels, a first current level followed by a second current level;

a plurality of transistors coupled together to form a differential amplifier circuit, wherein the differential amplifier circuit is coupled in parallel to the crystal clock; and a programmable control circuit providing a variable gain to the differential amplifier circuit via a gain input terminal, wherein the programmable control circuit comprises:

an analog to digital converter configured to digitize a clock output of the crystal clock to provide a digital output level of the clock output, wherein the programmable control circuit has an output coupled to provide the variable gain; and a register operably coupled to the analog to digital converter and configured to store a programmable digital threshold value, and wherein the programmable control circuit is configured to control, based on the digital output level and the programmable digital threshold value, the variable current source.

6. The clock circuit of claim 5, wherein the programmable control circuit is configured to control the variable current source by comparing the digital output level with the programmable digital threshold value.

7. The clock circuit of claim 5, further including a decoder coupled to the analog to digital converter.

8. The clock circuit of claim 5, further including a squaring circuit having an input coupled to an output of the variable gain circuit.

9. A clock circuit, comprising:

a differential amplifier having a first input coupled to a first crystal input and a second input of the differential amplifier coupled to a bias signal input, and an output of the differential amplifier coupled to a second crystal input, and a controllable current source that alters a current supply of the differential amplifier in response to a comparison between a digital output value of the output of the differential amplifier and a programmable digital threshold value.

10. The clock circuit of claim 9, wherein the differential amplifier has a variable gain established by at least the controllable current source.

11. The clock circuit of claim 10, further including a peak detect circuit coupled to the output of the differential amplifier.

12. The clock circuit of claim 11, wherein an output of the peak detect circuit is coupled to a gain control of the differential amplifier.

13. The clock circuit of claim 12, wherein the output of the peak detect circuit is a binary signal.

14. The clock circuit of claim 9, further including a squaring circuit having a first input coupled to the output of the differential amplifier and a second input coupled to an input signal.

15. The clock circuit of claim 9, wherein the second input of the differential amplifier is electrically isolated from the output of the differential amplifier.

16. The clock circuit of claim 9, wherein the differential amplifier comprises a differential pair of transistors having sources commonly connected to a current source node, and the controllable current source controls a current path between the current source node and a power supply node.

17. The clock circuit of claim 9, further comprising a register for storing the programmable digital threshold value.

18. The clock circuit of claim 9, further including an analog to digital converter having an analog input coupled to the differential amplifier output and a digital output coupled to the controllable current source.

19. The clock circuit of claim 18, further comprising a decoder that enables and disables current supply elements of the controllable current supply in response to an output of the analog to digital converter and the programmable digital threshold value.

* * * * *